(12) United States Patent
Wagner

(10) Patent No.: US 8,330,548 B2
(45) Date of Patent: Dec. 11, 2012

(54) LATCHED RING OSCILLATOR DEVICE FOR ON-CHIP MEASUREMENT OF CLOCK TO OUTPUT DELAY IN A LATCH

(75) Inventor: Israel A. Wagner, Zichron-Yaakov (IL)

(73) Assignee: International Business Machines Corporation, Armonk, NY (US)

( * ) Notice: Subject to any disclaimer, the term of this patent is extended or adjusted under 35 U.S.C. 154(b) by 153 days.

(21) Appl. No.: 12/860,143

(22) Filed: Aug. 20, 2010

(65) Prior Publication Data

US 2012/0044024 A1 Feb. 23, 2012

(51) Int. Cl.
*H03K 3/03* (2006.01)
(52) U.S. Cl. ............ 331/57; 368/118; 327/156; 702/79
(58) Field of Classification Search .................. 331/1 A, 331/57, DIG. 3; 702/79; 368/118
See application file for complete search history.

(56) References Cited

U.S. PATENT DOCUMENTS

| 6,144,262 | A | 11/2000 | Kingsley | |
|---|---|---|---|---|
| 6,396,312 | B1 * | 5/2002 | Shepston et al. | 327/105 |
| 6,850,123 | B1 * | 2/2005 | Verma et al. | 331/57 |
| 7,482,886 | B1 | 1/2009 | Kingsley | |
| 7,710,209 | B2 * | 5/2010 | Prodi et al. | 331/57 |

* cited by examiner

*Primary Examiner* — Arnold Kinkead
(74) *Attorney, Agent, or Firm* — Griffiths & Seaton PLLC

(57) ABSTRACT

A novel and useful apparatus and related method for on-chip measurement of the clock to output delay of a latch within an integrated circuit. The delay measurement mechanism enables measuring the time delay from the transition of the clock input to the data output of a latch. The output delay of the on-chip latch is measured by making the latch delay part of a ring oscillator and measuring its frequency of oscillation. A latch based delay stage is used to construct the ring oscillator in which a delayed short pulse derived from the input edge is used as the trigger for the latch. The latched ring oscillator mechanism of the invention can be used to measure the clock to output (C2Q) delay of on-chip latch devices.

14 Claims, 5 Drawing Sheets

LATCHED RING OSCILLATOR DEVICE FOR ON-CHIP MEASUREMENT OF CLOCK TO OUTPUT DELAY IN A LATCH

FIELD OF THE INVENTION

The present invention relates to the field of digital data and signal processing, and more particularly relates to a latched ring oscillator and related method for on-chip measurement of the clock to output delay of a latch.

SUMMARY OF THE INVENTION

There is thus provided in accordance with the invention, a latch based ring oscillator for on-chip measurement of clock to output delay of a latch, comprising a plurality of N delay stages coupled to each other to form a ring, each said delay stage comprising a latch wherein a delayed version of a signal input to said delay stage is used to trigger said latch, and wherein N is an odd number greater than or equal to three.

There is also provided in accordance with the invention, a method of calculating the clock to output delay of a latch, said method comprising incorporating the clock to output delay of said latch in a plurality N of delay stages of a ring oscillator circuit, and wherein a delayed pulse derived from the input to the delay stage is use to trigger said latch.

There is further provided in accordance with the invention, a method of calculating the clock to output delay of a latch, said method comprising providing a ring oscillator comprising a plurality of N delay stages coupled to each other to form a ring, wherein each said delay stage comprising a latch wherein a delayed version of a signal input to said delay stage is used to trigger said latch, and wherein N is an odd number greater than or equal to three, measuring a first oscillator frequency F1 of said ring oscillator, measuring a second oscillator frequency F2 of said ring oscillator with the latch in each delay stage effectively removed therefrom, and calculating the clock to output delay of said latch as a function of F1 and F2.

BRIEF DESCRIPTION OF THE DRAWINGS

The invention is herein described, by way of example only, with reference to the accompanying drawings, wherein.

DETAILED DESCRIPTION OF THE INVENTION

Figure 1:
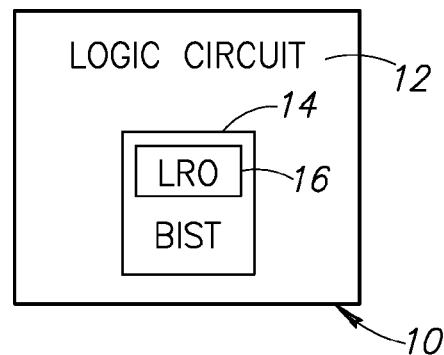
FIG. 1 is a block diagram illustrating an example integrated circuit logic circuit incorporating BIST and the latched ring oscillator of the present invention.

The present invention is a novel and useful apparatus and related method for on-chip measurement of the clock to output delay of a latch within an integrated circuit. The delay measurement mechanism enables measuring the propagation delay from the transition of the clock input to the data output of a latch. The output delay of the on-chip latch is measured by making the latch delay part of a ring oscillator and measuring its frequency of oscillation. A latch based delay stage is used to construct the ring oscillator in which a delayed short pulse derived from the input edge is used as the trigger for the latch. The ring oscillator incorporating such a latch is referred to as a latched ring oscillator (LRO). The latched ring oscillator mechanism of the invention can be used to measure the clock to output (C2Q) delay of on-chip latch devices.

A main advantage of the delay measurement mechanism is that measuring the frequency of a ring oscillator is significantly easier than measuring the phase difference between signals or generating signals having precise phase relationships and, in addition, making these signals available on and off the chip. Other advantages of the delay measurement mechanism include (1) the mechanism only requires an external frequency counter without the need for exact delay measurement and precision waveform generators; (2) the precision of the delay measurement does not depend on on-chip delay lines or counters; and (3) it is relatively simple to compare the performance of different versions of the latch circuit.

Latch devices are memory type devices widely used in circuit design. The clock to output delay parameter of a latch circuit forms a key part of the overall path delay in system incorporating memory and is thus a significant design parameter. Therefore, a proper evaluation of the delay is important in order to determine the length of the critical path as overestimation would imply too slow a clock frequency, while underestimation may cause logic failures. As discussed below, existing techniques for measuring this delay are complex and hence, the design of latch based circuits is typically based on simulation.

Prior art techniques for measuring clock to output delay typically entails measuring the delay off-chip using chip pads or probes and a waveform generator to produce data and clock signals. Costly and precision waveform generators, oscilloscopes, probes, cables and connectors are required to measure the delay. The problem with this technique is that it requires relatively precise and expensive equipment and depends on the behavior of the various cables, connectors and transmission lines which are mostly unpredictable. Another prior art technique to measure the latch delay is to create a "stopwatch" type circuit on-chip by means of a precision delay line. This requires measuring the delay on-chip using complex on-chip counters and delay lines which have the drawbacks of (1) having limited precision due to the limited precision of the delay line and (2) requiring a complex, costly process-dependent circuit that consumes significant chip real estate to realize.

Thus, measuring on-chip clock to output delay of a latch is typically difficult to perform. This is due to the difficulty in generating precise delays at high frequencies. It is even more difficult to provide the phases of clock and data to the latch within an integrated circuit because the probe/pad/line/connector delay is very complex to control and predict.

Latched Ring Oscillator (LRO) Based Clock to Output Delay Measurement Mechanism As described supra, the clock to output (C2Q) delay of an on-chip latch is measured by incorporating this delay into a ring oscillator (i.e. a latched ring oscillator (LRO)) and measuring its frequency of oscillation. A problem in making the clock to output delay part of a ring oscillator, however, is that a latch clock is generally twice as fast as its data input, thus simply connecting the latch would not enable the ring oscillator to oscillate. The latch delay mechanism of the invention solves this by providing a latch based delay stage circuit that is used to construct the ring oscillator. In each delay stage, a short pulse is derived from the input signal and a delayed version of this pulse is used as the clock trigger for the latch. In this manner, the frequency of the input to the delay stage is exactly the same as the frequency of its output. This enables the latch based delay stage to be incorporated into the ring oscillator. The oscillation frequency of the ring oscillator can be readily measured using an off-chip frequency counter. The oscillation frequency is then used in conjunction with a calibration step in determining the C2Q delay of the latch.

One application of the latch delay measurement mechanism of the invention is its incorporation into on-chip built-in self test (BIST) circuitry. A block diagram illustrating an example integrated circuit logic circuit incorporating BIST and the latched ring oscillator of the present invention is shown in FIG. 1. The integrated circuit, generally referenced 10, comprises logic circuitry portion 12, BIST circuitry 14 and a latched ring oscillator (LRO) circuit 16. In one embodiment, the appropriate test points of the LRO circuit are provided to chip pads to facilitate connection to an external frequency counter. Alternatively, an on-chip frequency counter can be used to measure the oscillation frequency and the resulting latch delay can be calculated using hardware, software or firmware or a combination thereof.

Figure 2:
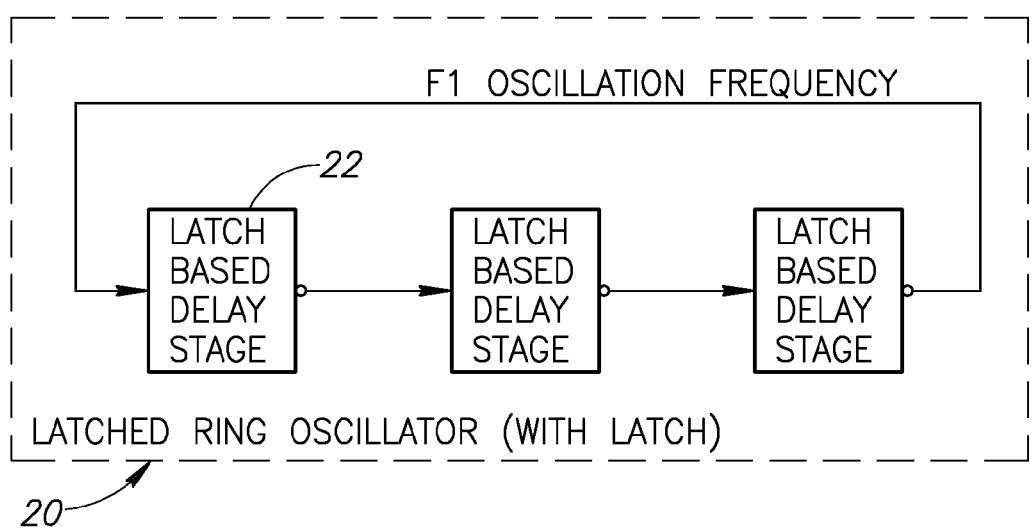
FIG. 2 is a block diagram illustrating an example latched ring oscillator circuit where each delay stage incorporates a latch.

A block diagram illustrating an example latched ring oscillator (LRO) circuit where each delay stage incorporates a latch is shown in FIG. 2. The LRO, generally referenced 20, comprises a plurality of latch-based delay stages 22 connected in daisy chain fashion where the output of one stage feeds the input of the subsequent stage. The oscillation frequency of the resulting LRO incorporating latches is denoted F1. Note that for illustration purposes only, the LRO is constructed from three delay stages in this example. It is appreciated that the LRO can be constructed using any odd number greater than or equal to three. Note further that there is a tradeoff to using either a large or small number of delay stages to construct the LRO. Using a larger number of delay stages serves to better average out variations in process between the delay stages while lowering the overall LRO oscillation frequency. The disadvantage is the increased chip real estate and power required to implement a large number of delay stages. In addition, long delay chains cause signal decay which may pose a limit on the number of delay stages that can be included in the LRO.

On the other hand, using a small number of delay stages reduces the power consumption and eliminates signal decay problems, but may cause the resulting delay measurement to be more susceptible to being biased by the process point. In addition, a small number of delay stages coupled with a fast process may result in too high oscillation frequencies (with regard to oscillation frequency measurement) requiring the addition of delay stages and/or frequency dividers to reduce the oscillation frequencies to reasonable numbers.

It has been found that an LRO constructed from 3 to 7 delay stages, as opposed to tens of delay stages, is a good compromise and yields acceptable results with regard to chip real estate, power consumption, ease of oscillation frequency measurement and signal decay.

Figure 4:
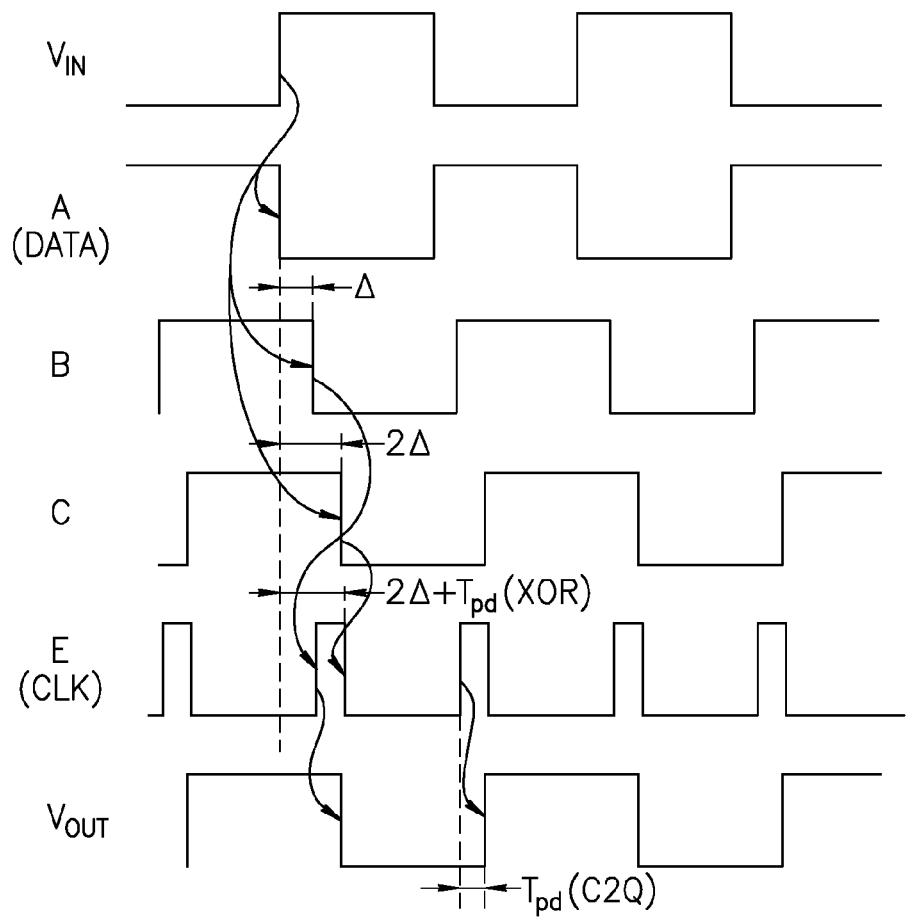
FIG. 4 is a logic timing diagram illustrating the timing relationship between the various signals of the latch based delay stage of FIG. 3.

A circuit diagram illustrating the latch based delay stage of FIG. 2 in more detail is shown in FIG. 4. The latch-based delay stage, generally referenced 30, comprises an inverter 32 coupled to $V_{in}$ 42, delay blocks 36, 38, XOR gate 40 and latch (e.g., D flip flop) 34 whose Q output is $V_{out}$ 44. In operation, the output signal of a previous stage is input to $V_{in}$ 42 where the signal is first inverted via inverter 32. The inverted signal output (signal A) is input to both the D input of the latch 34 and to a delay 36. The output (signal B) of the first delay 36 is input to a second delay 38 and to one of the inputs of the XOR gate 40. The output (signal C) of the second delay forms the second input of the XOR gate 40. The output of the XOR gate (signal E) serves as the clock signal input of the latch 34.

Figure 3:
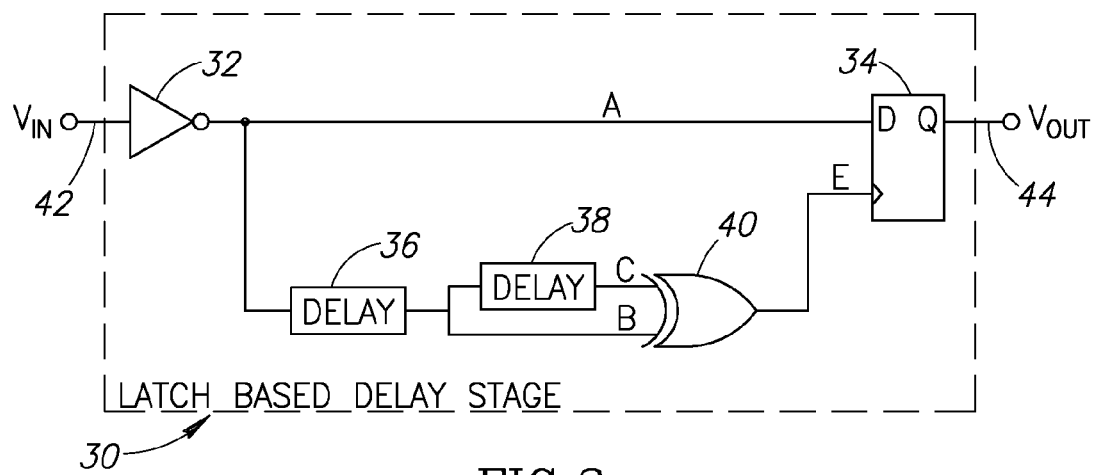
FIG. 3 is a circuit diagram illustrating the latch based delay stage of FIG. 2 in more detail.

A logic timing diagram illustrating the timing relationship between the various signals of the latch based delay stage of FIG. 3 is shown in FIG. 4. The signals shown include: $V_{in}$, A, B, C, E and $V_{out}$. The delay provided by delay block 36 is denoted Δ (signal B). Note that the delay functions to insure that the setup and hold time requirement for the data input to the latch is met. This signal is delayed again before being input to the XOR gate, i.e. signal C delayed a total 2Δ. The falling transition of signal B causes a positive transition of the output of the XOR gate which serves as the clock input to the latch 34. The falling edge of C causes a negative transition of the clock (signal E). The positive transition of signal E captures the data input (signal A) to the output Q ($V_{out}$). The time from the falling edge of signal A to the falling edge of the clock (signal E) is $2\Delta + T_{pd}(XOR)$, where $T_{pd}(XOR)$ is the propagation delay of the XOR gate. The delay from the rising edge of the clock input (signal E) to the rising edge of $V_{out}$ is the propagation delay of the latch (referred to as $T_{pd}(C2Q)$), the entity to be measured.

Thus, the inverted input signal A is used as the data input to the latch (D-input). Each transition of the data signal A is used to generate a pulse (signal E) used for the clock. The latch captures the data input (signal A) in accordance with the clock input (signal E) to generate the output $V_{out}$ which comprises an inverted and delayed version of the input $V_{in}$. The time delay of the delay stage 30 can be expressed as follows:

$$T_{pd}(\text{stage}) = T_{pd}(\text{inv}) + T_{pd}(\text{delay}) + T_{pd}(\text{XOR}) + T_{pd}(\text{C2Q}) \tag{1}$$

where $T_{pd}(\text{stage})$ is the propagation delay of the entire delay stage 30;

$T_{pd}(\text{inv})$ is the propagation delay of the inverter 32;

$T_{pd}(\text{delay})$ is the propagation delay of each of the delay blocks 36, 38;

$T_{pd}(\text{XOR})$ is the propagation delay of the XOR gate 40;

$T_{pd}(\text{C2q})$ is the propagation delay of the latch 34;

One way to determine the term $T_{pd}(\text{C2q})$ in Equation 1 is to individually measure the propagation delay of each of the components in the delay stage. At best, this is a tedious and difficult task with the potential for the introduction of numerous measurement errors. Rather than measure the propagation delay of each individual component, the frequency of oscillation of the LRO is measured instead with (frequency F1) and without (frequency F2) the latch in the circuit. This permits a relatively simple measurement to isolate the $T_{pd}(\text{C2q})$ term in Equation 1. The oscillation frequency of an on-chip LRO can be measured off-chip by bringing one or more LRO signals out to chip pins or pads accessible by external test equipment. Only a frequency counter is needed to measure the two frequencies. Alternatively, an on-chip frequency counter can be used to measure the F1 and F2.

Figure 5:
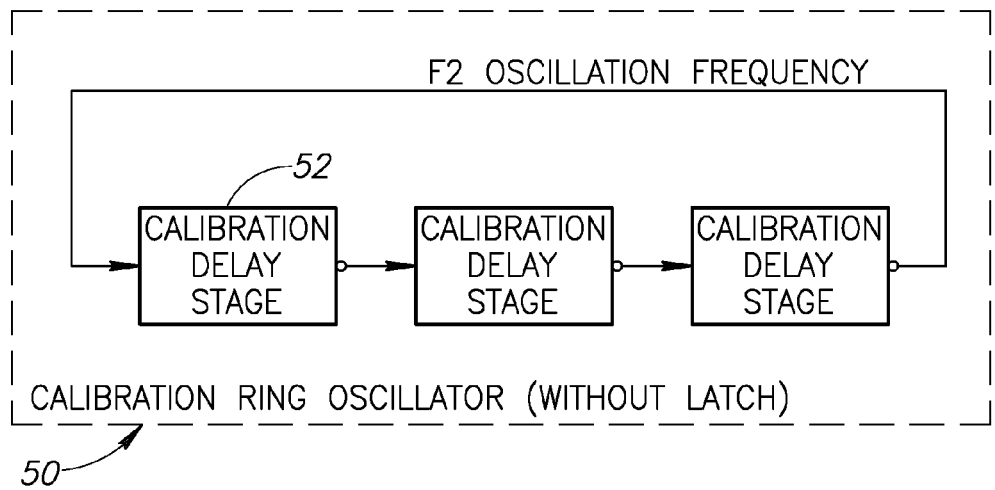
FIG. 5 is a block diagram illustrating an example calibration ring oscillator circuit with the latches removed in each calibration delay stage.

In one embodiment, the frequency of a replica of the LRO circuit is used wherein each delay stage is identical with the exception that there is no active latch. A block diagram illustrating an example calibration ring oscillator circuit with the latches removed in each calibration delay stage is shown in FIG. 5. The calibration ring oscillator (without an active latch), generally referenced 50, comprises a plurality of calibration delay stages 52 connected in daisy chain fashion where the output of one stage feeds the input of the subsequent stage.

Figure 6:
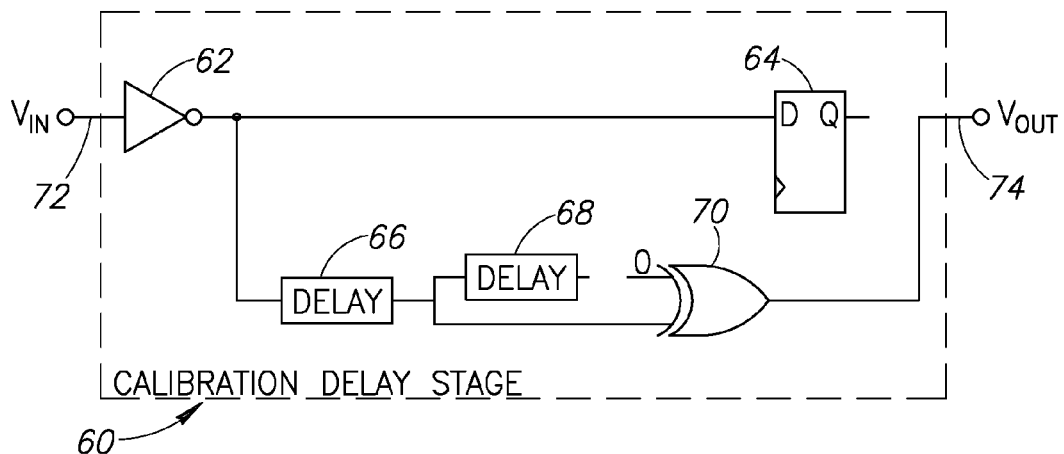
FIG. 6 is a circuit diagram illustrating the calibration delay stage of FIG. 5 in more detail.

A circuit diagram illustrating the calibration delay stage of FIG. 5 in more detail is shown in FIG. 6. The calibration delay stage, generally referenced 60, comprises inverter 62 coupled to $V_{in}$ 72, delay blocks 66, 68 and XOR gate 70 (latch 64 is either not included in the circuit or is in an inactive stage). In this case, the output of the XOR gate 70 forms $V_{out}$ 74. In operation, the output signal of a previous stage is input to $V_{in}$ 62 where the signal is first inverted via inverter 62. The inverted signal output is input to delay 66. The output of the first delay 66 is input to a second delay 68 and to one of the inputs of the XOR gate 70. The upper input of the XOR gate 70 is connected to a constant "0" in order to prevent a doubled frequency at the output 74.

The time delay of the calibration stage 60 (without latch) can be expressed as follows:

$$T_{pd}(\text{calib\_stage}) = T_{pd}(\text{inv}) + T_{pd}(\text{delay}) + T_{pd}(\text{XOR}) \quad (2)$$

where $T_{pd}(\text{calib\_stage})$ is the propagation delay of the entire calibration delay stage 60;

$T_{pd}(\text{inv})$ is the propagation delay of the inverter 62;

$T_{pd}(\text{delay})$ is the propagation delay of each of the delay blocks 66, 68;

$T_{pd}(\text{XOR})$ is the propagation delay of the XOR gate 70;

Using Equations 1 and 2, the clock to output delay (C2Q) of the latch can be calculated as follows:

$$T_{pd}(C2Q) = \frac{1}{2N}(T_{pd}(LRO) - T_{pd}(LRO\_calib)) \quad (3)$$

$$= \frac{1}{2N}\left(\frac{1}{F1} - \frac{1}{F2}\right)$$

where $T_{pd}(LRO)$ is the period of oscillation of the entire LRO (with the latch);

$T_{pd}(LRO\_calib)$ is the period of oscillation of the entire calibration LRO (without the latch);

N represents the number of delay stages making up the ring oscillator;

Note that the difference between the periods (or frequencies) is divided by 2 times the number of delay stages N, i.e. six in this example due to the three delay stages used to construct the LRO. Since the frequency measured represents two transitions for each cycle, the difference in the two periods must be compensated for by six. Thus, the calculation in Equation 3 is a function of the number of delay stages used to construct the LRO.

Figure 7:
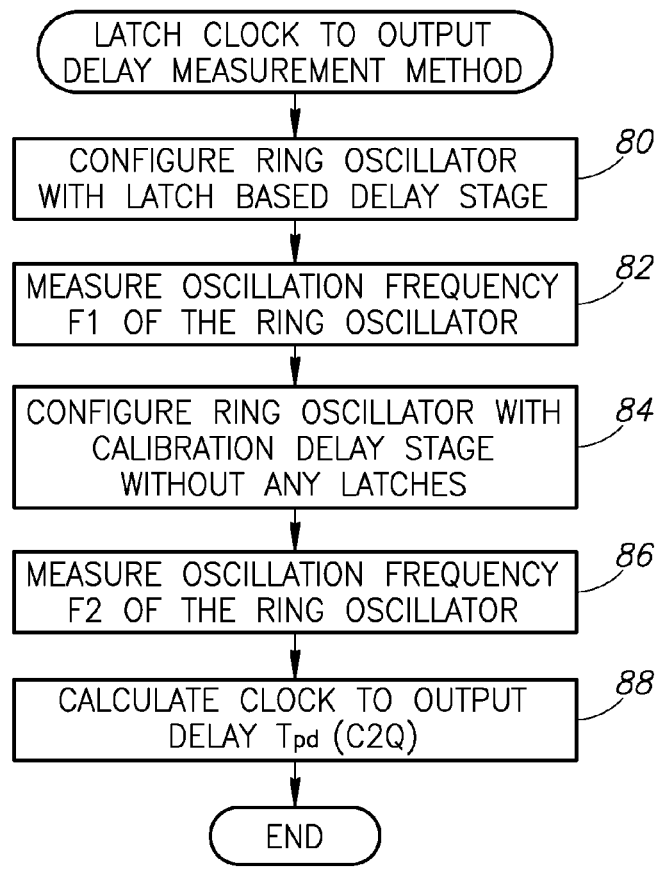
FIG. 7 is a flow diagram illustrating an latch clock to output delay measurement method.

A flow diagram illustrating an latch clock to output delay measurement method is shown in FIG. 7. First, the ring oscillator incorporating the latch based delay stage is configured (step 80). The oscillation frequency F1 of the ring oscillator (with latch) is measured (step 82). Then the ring oscillator with calibration delay stage (i.e. without any latches) is configured (step 84). The oscillation frequency F2 of the ring oscillator (without latch) is measured (step 86). The clock to output delay $T_{pd}(C2Q)$ is calculated using Equation 3 (step 88).

Figure 8:
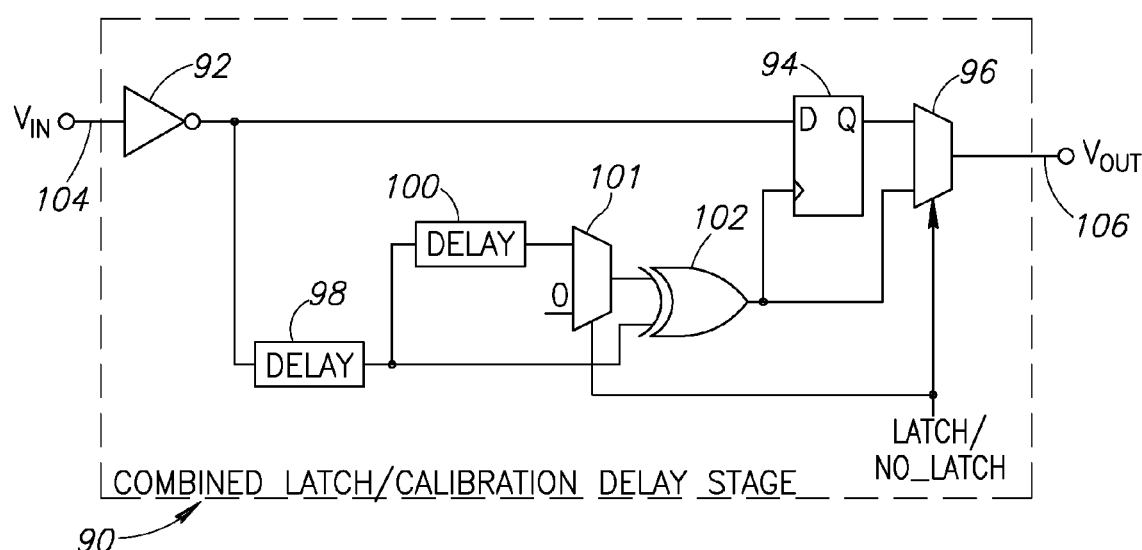
FIG. 8 is a circuit diagram illustrating an example alternative combined latch/calibration delay stage in more detail.

A circuit diagram illustrating an example alternative combined latch/calibration delay stage in more detail is shown in FIG. 8. As an alternative to the requirement of providing a replica of the latch based delay stage for calibration purposes, a combination latch/calibration delay stage can be used to construct the ring oscillator. The combined latch/calibration delay stage, generally referenced 90, comprises inverter 92 coupled to input $V_{in}$ 104, delay blocks 98, 100, XOR gate 102, latch 94 and 2-input multiplexers 96, 101.

In this embodiment, the multiplexer 96 selects either the Q output of the latch or the output of the XOR gate 102 as the $V_{out}$ of the delay stage. The multiplexer 101 selects either the output of delay 100 or a hard '0' input. The selection for both multiplexers 101, 96 is based on a LATCH/NO_LATCH control signal generated by upper layer software or by hardware (or a combination thereof). During operation, oscillation frequency F1 of the ring oscillator is measured by configuring multiplexer 96 to output the Q of the latch to $V_{out}$ 106 and to configure multiplexer 101 to output the signal from the delay unit 100 one of the inputs of XOR gate 102. To measure oscillation frequency F2 of the ring oscillator, multiplexer 96 is configured to output XOR gate output to $V_{out}$ and multiplexer 101 is configured to output the constant "0" to the input of the XOR gate 102.

Figure 9:
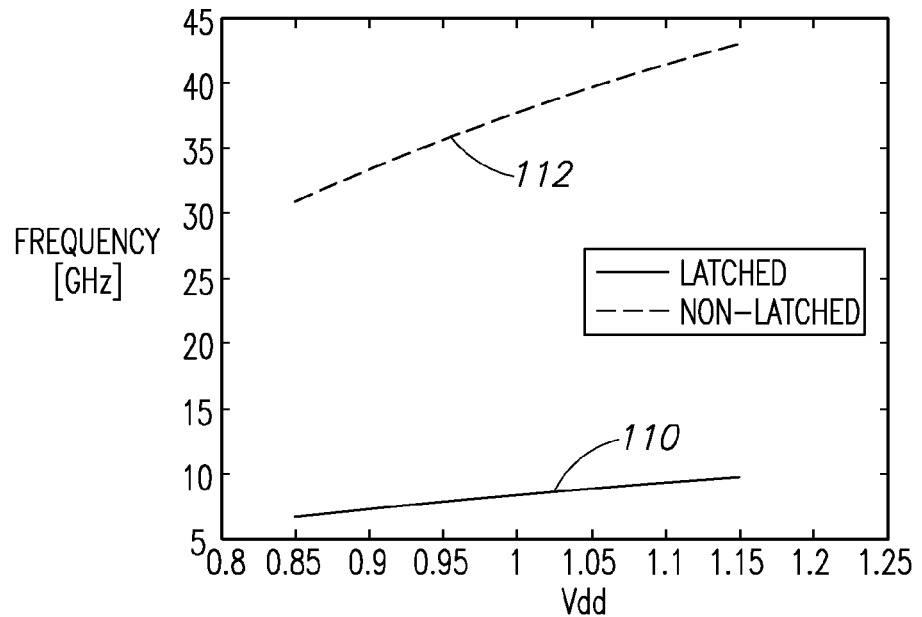
FIG. 9 is a graph illustrating oscillation frequency F1 (latched) and F2 (unlatched) as a function of $V_{DD}$.

A graph illustrating oscillation frequency F1 (latched) and F2 (unlatched) as a function of the supply voltage $V_{DD}$ is shown in FIG. 9. Oscillation frequency measurements were taken while $V_{DD}$ was varied from 0.85 to 1.15 V. The solid line 110 represents measurements of oscillation frequency F1 (latched). The dashed line 112 represents measurements of oscillation frequency F2 (without latch) for calibration purposes. Note that the removal of the latches from the delay stages causes a significant increase in the oscillation frequency.

Figure 10:
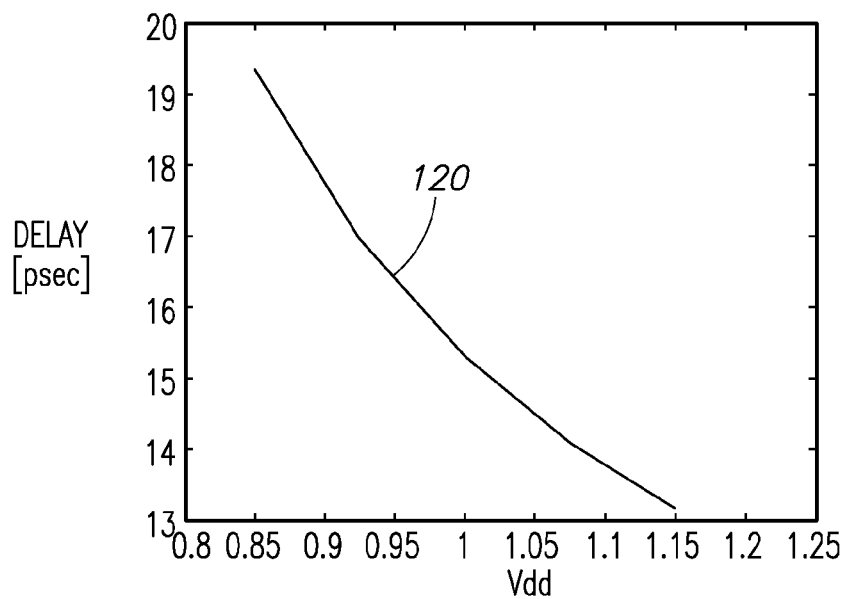
FIG. 10 is a graph illustrating clock to output delay (C2Q) as a function of $V_{DD}$.

A graph illustrating clock to output delay (C2Q) as a function of $V_{DD}$ is shown in FIG. 10. The F1 and F2 measurements of FIG. 9 are used to calculate the clock to output delay (C2Q) times (using Equation 3). The resulting $T_{pd}(C2Q)$ times in picoseconds is plotted as a function of the VDD (trace 120). Note the reduction in the clock to output delay of the latch by approximately 30% as VDD is increased from 0.85 to 1.15 V.

An example set of data used to construct the graphs of FIGS. 9 and 10 is presented below in Table 1.

TABLE 1

Oscillation Frequency F1, F2 and resulting C2Q delay times as a function of $V_{DD}$.

| $V_{DD}$ (Volts) | Oscillation Frequency F1 (with latch) (Hz) | Oscillation Frequency F2 (without latch) (Hz) | C2Q Delay (psec) |
|---|---|---|---|
| 0.850 | 6.737E9 | 30.91E9 | 19.3470 |
| 0.925 | 7.464E9 | 34.6E9 | 16.9809 |
| 1.000 | 8.45E9 | 37.9E9 | 15.3263 |
| 1.075 | 9.159E9 | 40.74E9 | 14.1061 |
| 1.150 | 9.782E9 | 43.1E9 | 13.1711 |

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An apparatus, comprising:
   a latch based ring oscillator for on-chip measurement of clock to output delay of a latch, including:
      a plurality of N delay stages coupled to each other to form a first ring;
      each said delay stage comprising a latch wherein a delayed version of a signal input to said delay stage is used to trigger said latch; and
   a non-latched ring oscillator, said non-latched ring oscillator including:
      a plurality of N calibration stages coupled to each other to form a second ring;
      each said calibration stage comprising a delay equal to the delay of said delay stage without said latch;
      wherein N is an odd number greater than or equal to three.

2. The apparatus according to claim 1, further comprising a first frequency measurement circuit operative to measure the oscillation frequency F1 of said latch based ring oscillator.

3. The apparatus according to claim 2, further comprising a second frequency measurement circuit operative to measure the oscillation frequency F2 of said non-latched ring oscillator.

4. The apparatus according to claim 3, wherein said oscillation frequencies F1 and F2 are adapted to be measured using an off-chip frequency counter.

5. The apparatus according to claim 3, further comprising a delay calculator operative to calculate the clock to output delay of said latch as a function of oscillation frequencies F1 and F2.

6. The apparatus according to claim 5, wherein said clock to output delay of said latch is calculated as $$\left(\frac{1}{F1} - \frac{1}{F2}\right)/(2N).$$

7. A method of calculating the clock to output delay of a latch, said method comprising:
   incorporating the clock to output delay of said latch in the plurality N of delay stages of a ring oscillator circuit; wherein a delayed pulse derived from the input to the delay stage is used to trigger said latch;
   measuring a first oscillation frequency F1 of said ring oscillator; and
   measuring a second oscillation frequency F2 of said ring oscillator with said N latches effectively out of said ring oscillator circuit.

8. The method according to claim 7, wherein said oscillation frequencies F1 and F2 are adapted to be measured using an off-chip frequency counter.

9. The method according to claim 7, further comprising calculating the clock to output delay of said latch as a function of F1 and F2.

10. The method according to claim 9, wherein the clock to output delay of said latch is calculated using $$\left(\frac{1}{F1} - \frac{1}{F2}\right)/(2N).$$

11. A method of calculating the clock to output delay of a latch, said method comprising:
   providing a ring oscillator comprising a plurality of N delay stages coupled to each other to form a ring, wherein each said delay stage comprising a latch wherein a delayed version of a signal input to said delay stage is used to trigger said latch, and wherein N is an odd number greater than or equal to three;
   measuring a first oscillator frequency F1 of said ring oscillator;
   measuring a second oscillator frequency F2 of said ring oscillator with the latch in each delay stage effectively removed therefrom; and
   calculating the clock to output delay of said latch as a function of F1 and F2.

12. The method according to claim 11, second oscillator frequency F2 of said ring oscillator is measured using a replica of said ring oscillator with the latch in each delay stage removed.

13. The method according to claim 11, wherein the clock to output delay of said latch is calculated using $$\left(\frac{1}{F1} - \frac{1}{F2}\right)/(2N).$$

14. The method according to claim 11, wherein said oscillation frequencies F1 and F2 are adapted to be measured off-chip using a frequency counter.

* * * * *